(12) United States Patent
Stocker et al.

(10) Patent No.: US 6,267,647 B1
(45) Date of Patent: *Jul. 31, 2001

(54) GRINDING MACHINES AND POLISHING MACHINES

(75) Inventors: Mark Andrew Stocker, West Hunsbury; Dermot Robert Falkner, Skipton; Paul Martin Howard Morantz, Newport Pagnell; Michael George Pierse, Bedford, all of (GB)

(73) Assignee: Unova U.K. Limited, Aylesbury (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/273,057

(22) Filed: Mar. 19, 1999

Related U.S. Application Data

(62) Division of application No. 09/194,706, filed as application No. PCT/GB97/01569 on Jun. 11, 1997.

(30) Foreign Application Priority Data

| Jun. 15, 1996 | (GB) | 9612594 |
| Dec. 19, 1996 | (GB) | 9626397 |
| Dec. 19, 1996 | (GB) | 9626415 |

(51) Int. Cl.$^7$ .................................................. B24B 9/06
(52) U.S. Cl. ............................ 451/44; 451/56; 451/58; 451/443; 451/461
(58) Field of Search .......................... 451/6, 43, 21, 451/23, 44, 443, 56, 461, 58

(56) References Cited

U.S. PATENT DOCUMENTS

| 3,361,018 | * | 1/1968 | Druckman | 451/14 |
| 4,607,461 | * | 8/1986 | Adams | 451/14 |
| 4,826,127 | * | 5/1989 | Koblischek et al. | 248/679 |
| 4,953,522 | * | 9/1990 | Vetter | 125/11.01 |
| 5,289,661 | * | 3/1994 | Jones et al. | 451/44 |
| 5,595,528 | * | 1/1997 | Becker | 451/72 |
| 5,609,514 | * | 3/1997 | Yasunaga et al. | 451/44 |
| 5,643,052 | * | 7/1997 | Delattre et al. | 451/21 |
| 5,658,189 | * | 8/1997 | Kagamida | 451/66 |

* cited by examiner

Primary Examiner—Joseph J. Hail, III
Assistant Examiner—G Nguyen
(74) Attorney, Agent, or Firm—Lee Mann Smith McWilliams Sweeney & Ohlson

(57) ABSTRACT

A method of grinding the edge of a disc uses a grinding machine having mounted thereon a grooved grinding wheel, in which the groove is formed in situ using a forming wheel also mounted on the grinding machine. After a workpiece has been ground or after a succession of workpieces have been ground, re-engaging the grinding wheel and the forming wheel with the grinding wheel remaining in situ, to re-form the groove in the grinding wheel to correct for wear. A grinding machine comprises a grinding wheel, drive means therefor, a workhead and workpiece spindle and drive means therefor, a forming wheel and drive means therefor, means for moving the grinding wheel so as to plunge grind the edge of the grinding wheel to form a groove therein of precise cross-section and means for effecting relative movement between the grinding wheel and the forming wheel to enable the grinding wheel to engage with the edge of a circular workpiece component mounted on the workpiece spindle to edge grind the component and wherein the forming wheel is also mounted on the workpiece spindle for rotation therewith, and the grinding wheel is a resin bonded wheel.

4 Claims, 15 Drawing Sheets

GRINDING MACHINES AND POLISHING MACHINES

RELATED APPLICATION

This application is a division of copending U.S. patent application Ser. No. 09/194,706, filed Dec. 15, 1998, which is the national filing of International Application No. PCT/GB97/01569 filed Jun. 11,1997

This invention concerns grinding and polishing machines and methods of grinding and polishing discs such as wafers of silicon for use in the construction of semi-conductor devices, and discs of glass or other brittle materials on which magnetic material is to be deposited for forming magnetic memory disks for computer disk drives and the like.

BACKGROUND TO THE INVENTION

When grinding discs for either of the above purposes, it is important that the outside diameter of the disc is finished to a high level of accuracy and often to a particular cross-sectional form. In the case of memory disk a circular opening is also required again to an accurately controlled diameter and circularity. In the case of silicon wafers, registration in later manufacturing steps requires registration devices to be formed around the periphery of the disc such as the formation of flats and notches.

Conventionally edge grinding and polishing machines have incorporated linear slideways for all axes. Whether incorporating re-circulating rolling element bearings or air bearings, all such axes share a common failing when grinding and polishing brittle material namely they permit significant relative motion between grinding wheel and component. This arises from the need to provide for orthogonal movements of grinding wheels usually obtained by stacking one linear axis above another. This motion requires the use of hard wearing grinding wheels to minimise loss of form due to wear, but such wheels tend to produce poor quality surfaces with deep damage.

When grinding silicon wafers, the depth of sub-surface damage arising during grinding should be minimised as a wafer must be delivered with zero damage for use in subsequent manufacturing steps. When sub-surface damage has arisen, this means a post grinding step of acid etching before polishing. Both processes are expensive, and the less the damage the shorter the polishing time that is needed.

Normally the edge of a wafer or disc workpiece is machined so as to create a generally triangular or trapezoidal edge profile to the disc. In order to achieve this the surface of the grinding wheel is formed in a complementary manner so that as the wheel is engaged with the workpiece the complementary form is generated around the edge thereof.

The edge profile will only be generated accurately if the complementary form of the grinding wheel does not alter. Clearly as the grinding wheel wears, this profile will change and periodically such wheels have to be re-formed using a suitable forming wheel for resin bond wheels or spark erosion for metal bond wheels. Hitherto at least the initial forming of the complementary grinding wheel profile has been done "off machine" since hard wearing grinding wheels have tended to be used.

SUMMARY OF THE INVENTION

In accordance with one aspect of the present invention a grinding machine includes at least one forming wheel which is mounted so as to be capable of being engaged with the main grinding wheel to allow a groove in the latter to be formed and reformed as required.

This obviates problems which can arise when a grinding wheel is initially formed off machine and/or has to be removed to be reformed. By constructing a grinding machine as hereinafter described, so as to restrict, if not eliminate, unwanted relative motion between workpiece and grinding wheel, it has been found that softer grinding wheels can be used.

Resin bonded CBN or diamond wheels may be employed, although optimum efficiency may be obtained by using a harder grinding method such as a metal bonded CBN or diamond wheel in a preliminary rough grinding step and then using the softer wheels to ginish grind. The different wheels can of course all be mounted on the same spindle.

Each grinding wheel may be provided with a plurality of grooves, which can be used in turn, as each in turn becomes worn, until all the grooves need re-forming.

Resin bonded wheels have been found to produce very low sub-surface damage when used to grind edge forms, and can be formed in situ (ie in position on the grinding machine) using a suitable forming wheel.

Preferably and in accordance with another aspect of the invention, the forming wheel may be mounted on the workhead spindle, typically to the rear of the workpiece support.

Two forming wheels may be mounted on the workhead, one for forming grooves in new wheels and one for reforming grooves on existing wheels. Forming and reforming grinding wheel grooves on the machine and mounting the forming wheels on the workhead spindle reduces grinding wheel run-out to a minimum, reduces wheel chatter, and also ensures that even if imperfectly mounted, a true circular disc or wafer will be ground by the grinding wheel since the forming wheel, and reforming wheels are both mounted about the same axis as the workpiece.

Using one forming wheel for roughing and one for finishing both grinding wheels produces an identical form in both the roughing and finishing wheel grooves, thereby minimising asymetric wear of the finishing wheel form.

Using slightly different forms in the two forming wheels ensures that a constant depth of material is removed from around the edge profile during finish grinding.

Mounting two completely different forms, allow rapid changeover between one form type and the other, without the need to change formers.

The use of a resin bonded CBN wheel for rough grinding wafers and discs as aforesaid represents an important advantage. If a coarse diamond grain grinding wheel were to be used it would be virtually impossible to form or reform the wheel using diamond formers.

Coarse and medium grain CBN is very easy to form using a diamond forming wheel. However fine grain CBN such as required for finish grinding wheels will not grind silicon. Finish grinding is therefore preferably achieved using a fine grain diamond wheel which can be formed and reformed using diamond forming wheels.

The invention thus also lies in the combination of a tight stiffness loop between grinding wheel and workpiece support and the use of a relatively compliant resin bonded grinding wheel, together with a forming wheel which may be mounted on the wheelhead spindle, and which can be brought into play as and when required. These features, when combined, allow a high surface finish and low sub-surface damage edge to be produced on a workpiece.

The invention additionally provides a method of grinding the edges of discs comprising the steps of providing a grinding wheel and a forming wheel on a stiff mounting, moving the grinding wheel and forming wheel into engagement so as to form a groove around the edge of the grinding wheel corresponding in cross-section to the complement of the shape to be formed around a disc edge during grinding, engaging the grinding wheel with a disc which is also stiffly mounted relative to the grinding wheel, grinding the edge thereof into the desired shape, and after the disc edge has been ground (or after a succession of disc edges have been ground), re-engaging the grinding wheel and the forming wheel to re-form the groove in the grinding wheel to correct for wear.

A grinding process for grinding the edge of a silicon wafer workpiece may comprise two stages, a first in which a metal or resin bonded CBN wheel is advanced to rough grind the workpiece edge and a second stage in which a resin bonded CBN, or more preferably a resin bonded diamond wheel, is advanced to finish grind the edge, although the invention is not limited to this process and any number of different grinding steps may be incorporated into the process set up to grind any particular workpiece.

In accordance with the invention the method also includes the steps of forming and reforming both grinding wheels in situ on the machine by plunge grinding the desired form in the edge of each grinding wheel using a forming wheel.

Where both internal and external diameters are to be finish ground, a two-stage grinding process may be employed for both internal and external grinding, in which a rough grind using a pre-formed metal bonded wheel precedes a finish grind using a formed CBN resin bonded wheel which is formed and reformed in situ on the machine.

The invention also lies in apparatus for performing the above method comprising a grinding wheel and drive means therefor, a forming wheel, support means for the grinding wheel and forming wheel which is stiff to restrict unwanted relative movement therebetween, means for axially shifting the grinding wheel into alignment with the forming wheel, means for effecting relative movement between grinding and forming wheels to plunge grind the edge of the grinding wheel to form a groove therein of precise cross-section, a workpiece spindle on which a circular workpiece can be mounted, said spindle also being carried by the stiff support means, drive means for moving the grinding wheel towards and away from the workpiece spindle, to bring the wheel into engagement with a circular edge of a circular workpiece when mounted on the spindle to edge grind the workpiece, and drive means for rotating the spindle wherein the forming wheel is also mounted on the workpiece spindle for rotation therewith.

Preferably the workpiece spindle includes a vacuum chuck for mounting a circular workpiece thereon.

Optical inspection means may be provided for viewing the face of the workpiece when mounted for rotation, so that a plurality of measurements can be made and compared with reference measurements.

Other aspects and features of the invention are defined in the appended claims.

BRIEF DESCRIPTION OF THE DRAWINGS

The invention will now be described by way of example, with reference to the accompanying drawings, in which.

DETAILED DESCRIPTION OF THE DRAWINGS

Figure 1:
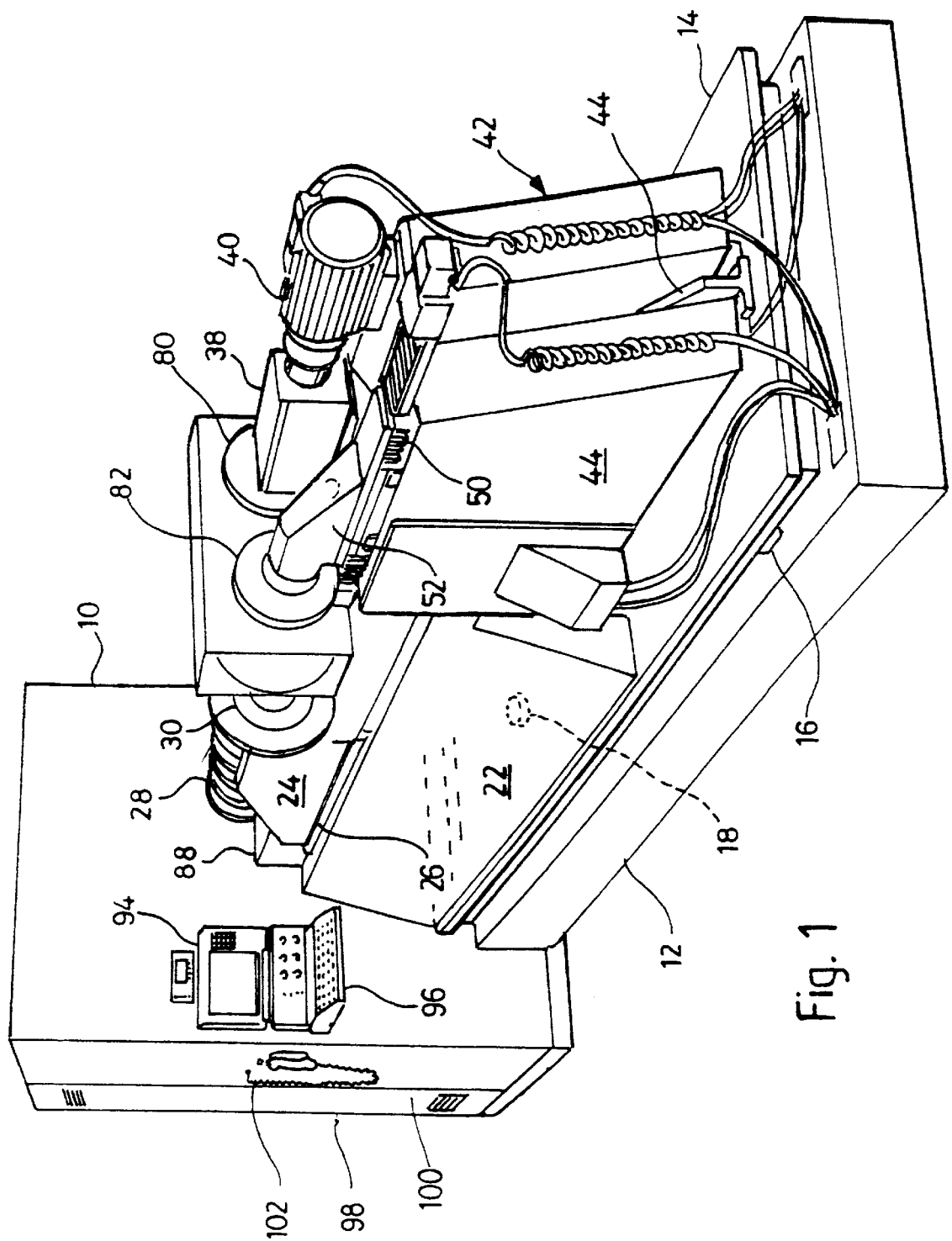
FIG. 1 is a perspective view not to scale of a grinding machine embodying the invention as viewed from the position normally occupied by an operator.
Figure 2:
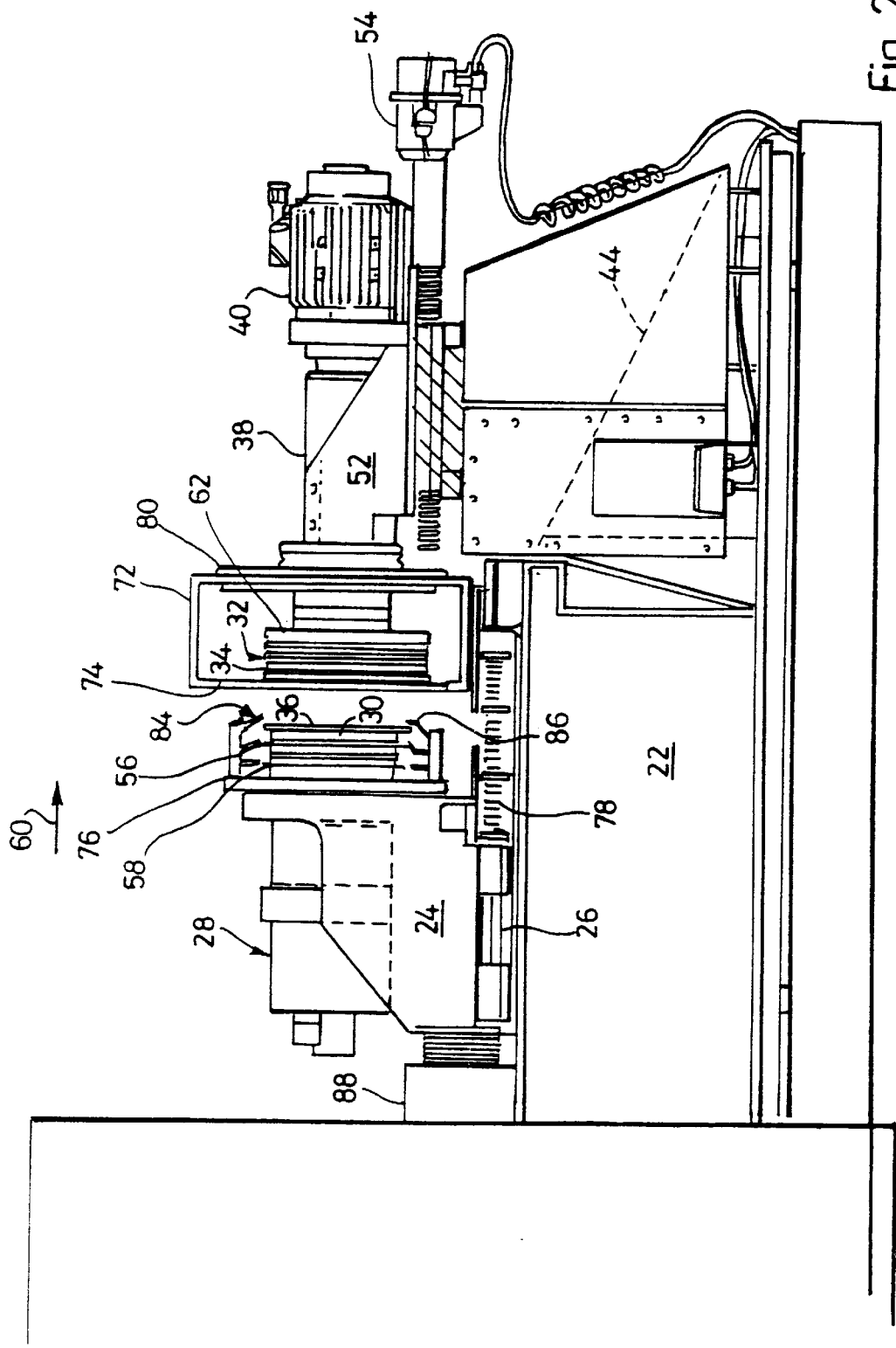
FIG. 2 is a side view again not to scale, of the machine shown in FIG. 1, again from the side on which the operator normally stands.
Figure 3:
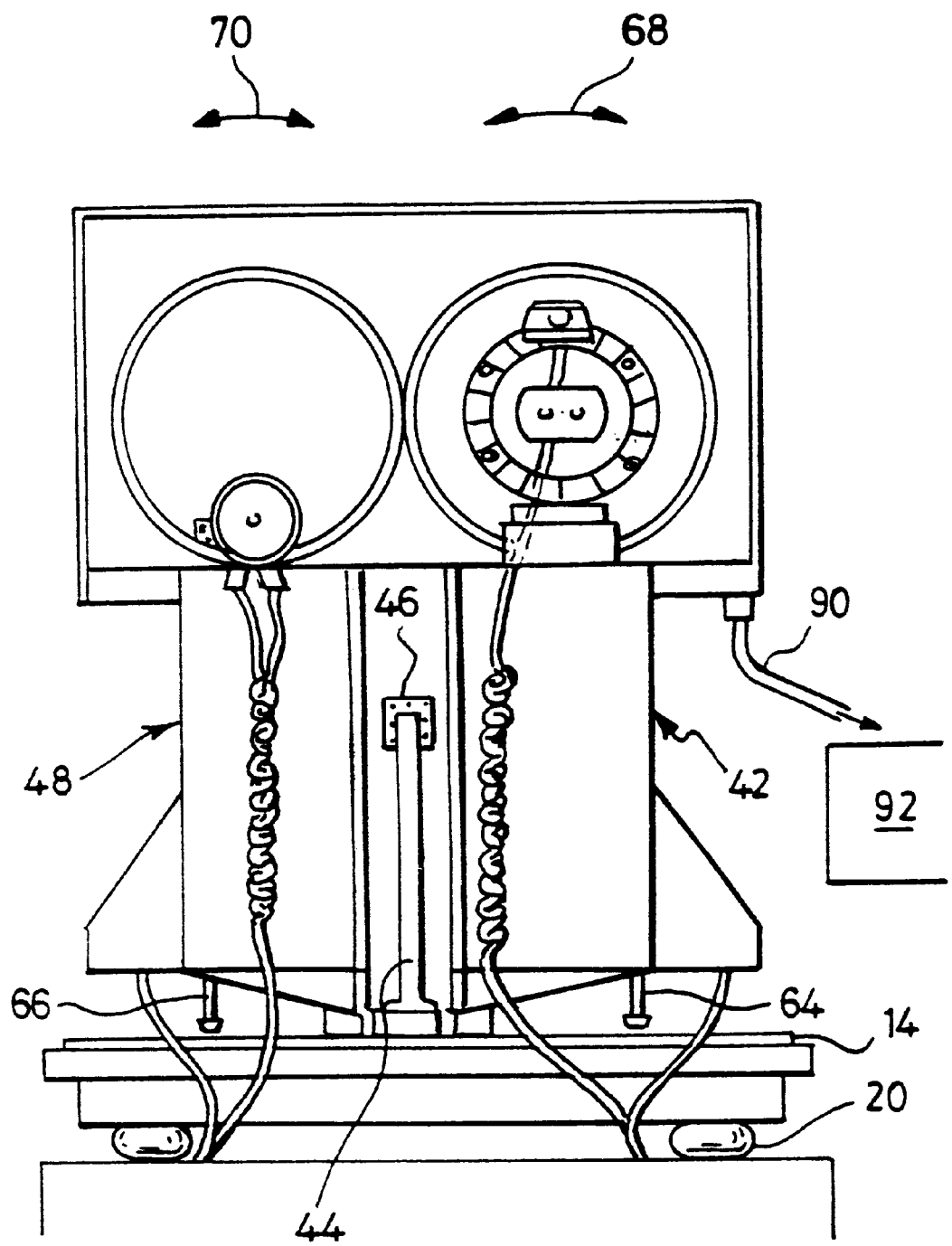
FIG. 3 is an end view of the machine shown in FIGS. 1 and 2.

FIGS. 1, 2 and 3 illustrate pictorially part of an overall machine station for edge grinding circular discs (wafers) of silicon or similar material. Workpiece handling inspection and centering facilities also form part of the overall machine but will be described with reference to later views in the drawings.

The machine shown in FIGS. 1 to 3 comprises a control cabinet 10 from which extends a machine bed 12 which carries a floating platform 14 carried on three vibration absorbing feet, one of which can be seen in FIG. 1 at 16 and the second part 18 is mounted centrally before the base region 22 and is shown in dotted outline in FIG. 1, and the third can be seen at 20 in FIG. 3.

The platform 14 includes an integral support structure or base 22 which carries a workhead 24 which is slidable axially along a slideway 26 mounted on an upper surface of the base 22 and which includes a spindle drive motor 28 and vacuum chuck 30 for carrying wafers to be ground.

Edge grinding is achieved by means of a grinding wheel 32 containing a number of annular grooves such as 34 for engaging the edge of a wafer workpiece designated in FIG. 2 at 36.

The grinding wheel spindle (not shown) carried in bearing assembly 38 is rotated by an electric motor 40.

Items 38 and 40 are carried on a support generally designated 42 which is mounted close to the centre line of the platform 14 to one side of a rigid strengthening plate 44 which is bolted through flanges to the platform 14 along its base and is secured at its upper end by bolts through another flange 46 to the machine base 22. The function of the plate 44 is to increase the rigidity of the platform 14 relative to the base 22 and resist transverse vibrations which might otherwise be introduced.

Equidistant from and on the other side of the plate 44 is a second support 48 which carries a slideway 50 on which is mounted a second spindle drive 52 for a notch grinding spindle. Axial movement of the spindle drive 52 is provided by a drive unit 54 (see FIG. 2). The spindle drive 52 can also be used to grind the internal diameter of an annular disc.

The workhead edge grinding and notch grinding spindles are mounted in air bearings and the workhead spindle typically has a speed range of 2 to 1000 revs per minute, the edge grinding spindle typically has a speed range up to 6000 revolutions per minute and the notch griding spindle speed is typically up to 70,000 revolutions per minute.

On the workhead spindle to the rear of the chuck 30 are mounted forming wheels best seen in FIG. 2 at 56 and 58. Indexing the workhead 24 in the direction of the arrow 60 in FIG. 2 allows the workpiece disc 36 to be engaged by one of the slots such as 34 in the grinding wheel 32 and further movement in the direction of the arrow 60 allows the disc 36 to clear the end face 62 of the grinding wheel assembly and to allow the forming wheels 56 or 58 to engage in the appropriate grooves in the grinding wheel 32.

Lateral movement of the grinding wheel or notch grinder as required is achieved by tilting the support structures 42 and 48 as appropriate relative to the platform 14. To this end both of the structures 42 and 48 are pivotally attached to the platform 14 near the centre line thereof (as will be described in more detail in relation to later figures) and two stops 64 and 66 respectively (see FIG. 3) prevent excessive outward movement.

In accordance with the invention, the pivoting is provided by means of flexures (as will be described) which allow for pivoting movement about two parallel axes close to the centre line of the platform 14 so that structure 42 can describe a small arc such as denoted by arrow 68 and structure 48 can describe an arc as denoted by reference numeral 70.

Drive means for achieving the pivoting movement will be described with reference to later figures.

Attached to the base 22 is a clear Polycarbonate rectilinear housing 72 through which the grinding wheel spindle protrudes. A large, generally oval opening 74 in the face of the housing 72 allows a similarly shaped closure 76 mounted on the workhead 24 to enter and seal off the opening 74 upon appropriate forward movement of the workhead 24 in the direction of the arrow 60 as aforesaid.

An inflatable ring seal 78 around the closure 76 (or alternatively around the internal lip of the opening 74) provides for a fluid tight seal between the closure 76 and the opening 74.

The housing 72 is slidable relative to the base 22 and bellows seals 80 and 82 are provided between the spindle drives 38 and 52 so that after the seal has been made between the closure 76 and the opening 74, the housing 72 will in fact move axially with the workhead assembly 24. Sufficient clearance is provided to the rear of the bellows to allow the housing 72 to move in a continuing sense in the direction of the arrow 60 to allow for the grooves in the grinding wheel to be formed. Movement in the opposite sense is also accommodated by the bellows 80 and 82 so that the closed housing 72 can also follow the workhead 24 as it moves in an opposite sense to that of arrow 60 to allow for the edge of the disc 36 to be engaged by one of the grinding grooves such as 34.

Coolant fluid is sprayed onto the workpiece through nozzles 84 and 86 and similar nozzles are provided for spraying similar fluid onto the forming wheels when required. An interlock is provided to prevent coolant fluid being jetted unless the housing 72 is closed and sealed by the closure 76.

After a grinding operation has been completed and after a final wash with fluid, the housing 72 can be opened by deflating the edge seal 78 and withdrawing the workhead 24 in a direction opposite to that of arrow 60 to the position shown in FIG. 2. The finished workpiece 36 can then be demounted and a fresh workpiece installed.

WHEEL FORMING/DRESSING

Wheel forming can be performed initially before any workpiece has been mounted, in which case the housing 72 is closed by appropriate movement of the workhead 24 and closure 76 without first mounting a workpiece such as 36 on the chuck 30. Wheel forming is performed by appropriate axial movement of the workhead 24 and lateral movement of support 42, so that each of the grooves in turn, such as groove 34, is engaged by the appropriate forming wheel such as 56 or 58. Coolant fluid is provided during the wheel forming operation.

After initial wheel forming, the assembly may be separated by breaking the seal 78 as before mentioned. After mounting a workpiece 36 the assembly can be closed again and grinding undertaken as before described.

Typically re-forming of the groove is performed during machine downtime after one workpiece has been removed and before a subsequent workpiece has been installed, but in a development of the machine in which edge profile checking of the workpiece 36 is performed in situ on the workhead, it may be advantageous to allow for re-forming with the workpiece in place.

Notching

If a workpiece is to be notched, the support 42 is moved laterally to disengage the wheel from the workpiece and support 48 is moved laterally instead so as to engage the edge of the workpiece 36 by the notching spindle (not shown). After notching, the support 48 is moved in an opposite sense so as to disengage the spindle from the workpiece.

Polishing

In an alternative arrangement, a polishing wheel may be mounted on the wheel spindle as well as the grooved grinding wheels, and by axially shifting the workpiece spindle, so the polishing wheel can be brought into engagement with the edge of the workpiece 36.

A drive for shifting the workhead 24 along the slideway 26 is provided at 88.

As shown in FIG. 3, a drainpipe 90 conveys fluid from the housing 72 to a storage tank 92 and a pump (not shown) is provided to recirculate the fluid from the tank. A filter may be provided in the tank or in the line between the tank and the pump.

The control housing 10 includes a television display 94 and keyboard 96 and a hand-held control unit 98 is connected via a flying lead 100 to a connection plug 102. An operator can remove the unit 98 and walk to the machine with the unit 98 in his hand, and by pressing appropriate buttons instigate or arrest operation of the machine. The housing 10 houses a computer based control system for supplying control signals and power to the drives on the machine and for receiving signals from transducers, switching and other position/operation/touch etc signal generating sensors on the machine.

A computer keyboard and display may be used to enter data for initially setting up the machine functions, and for determining the spindle speeds, feed rates, stroke and sequence of events.

Since clean room conditions may be required, the whole machine with the exception of the corner of the control unit containing the computer screen and keyboard, may be housed within an external enclosure. The external enclosure is not shown in the drawings.

The slideway 26 on which the workhead slides, is preloaded, and the workhead is driven by server motors and fitted with a high resolution position coder to provide smooth motion during axis move interpolation.

Grinding infeed is achieved as previously described by tilting the structures 42 or 48 as required to bring the grinding element carried thereon into engagement with the edge of the workpiece 36. Although the movement is not truly linear, but arcuate, this can be accommodated in the control signals generated by the control system housed within the housing 10.

Whilst the jets such as 84 and 86 can be used to supply cutting fluid during grinding, they or other jets may be used to direct jets of cleaning fluid at the overhanging lip of the wafer whilst it is still being rotated but after grinding. This prevents grinding swarf from running down the back face of the wafer as it is removed from the chuck.

Grinding process

Typically edges are ground in a two-stage process using a plunge grind roughing operation and a second plunge grind finish cycle which includes a rapid advance of the grinding wheel until a touch sensor detects contact with the workpiece wafer. The grinding wheel axis position at touchdown is used to monitor wheel wear and to ensure that the material removed per finish cut cycle is kept constant. Grinding wheelforms are maintained by using metal bonded diamond forming wheels permanently mounted on the workhead chuck. The reforming process can be fully automatic and can be programmed to occur every nth wafer, or whenever the ground edge profile becomes unacceptable (as determined by optical inspection of the disc edge profile) or when the touchdown point indicates excessive wheel wear.

Damping

In order to reduce unwanted vibration and resulting grinding damage to the minimum, the structural components making up the grinding machine are filled at least partially with polymer concrete, particularly sections of the base 22 and the bed 12 and if desired also the platform 14.

Subassembly flexure mounting

Figure 4:
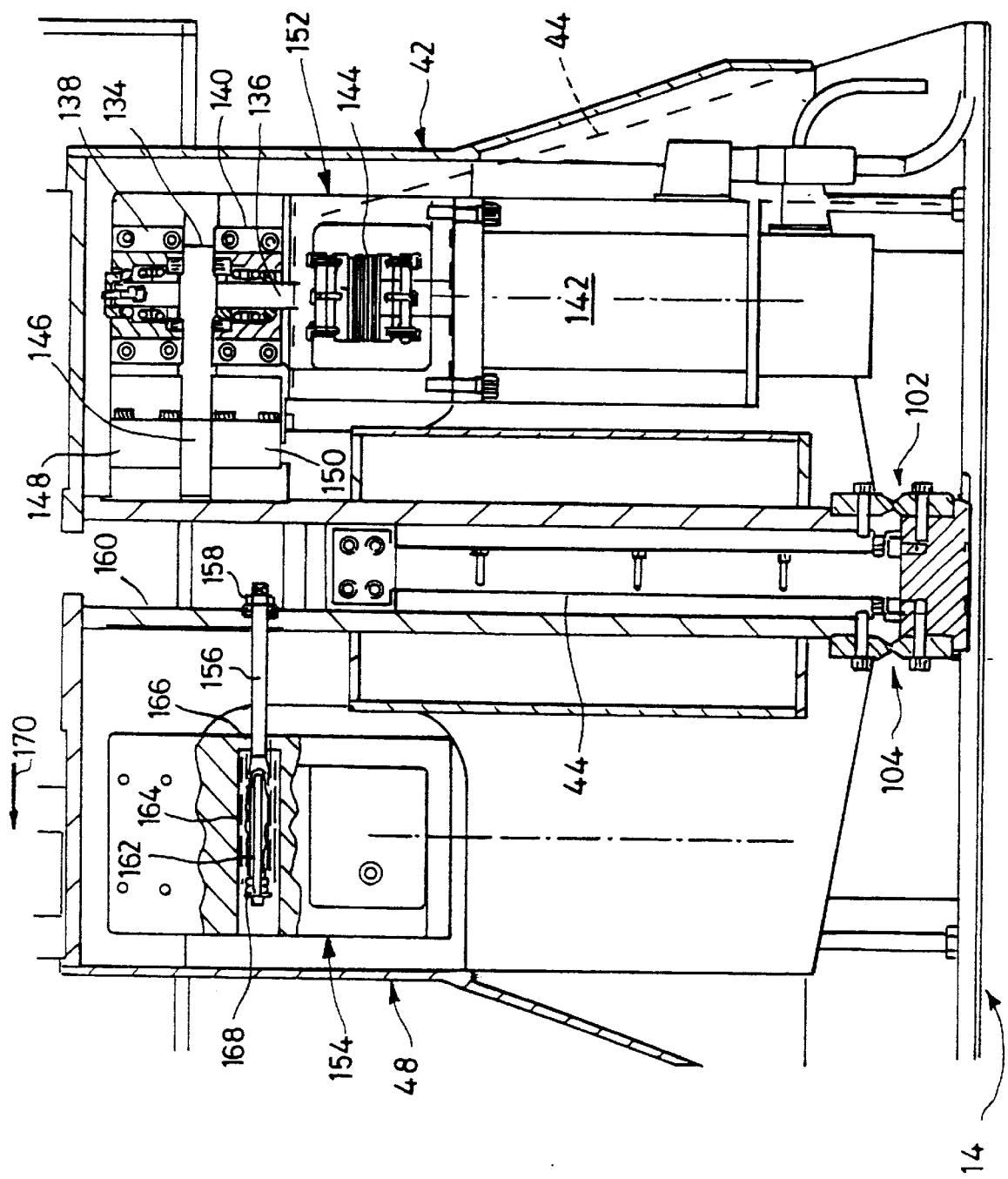
FIG. 4 is a cross-section to a slightly larger scale through the flexure mounted sub-assemblies as viewed end-on in FIG. 3.
Figure 5:
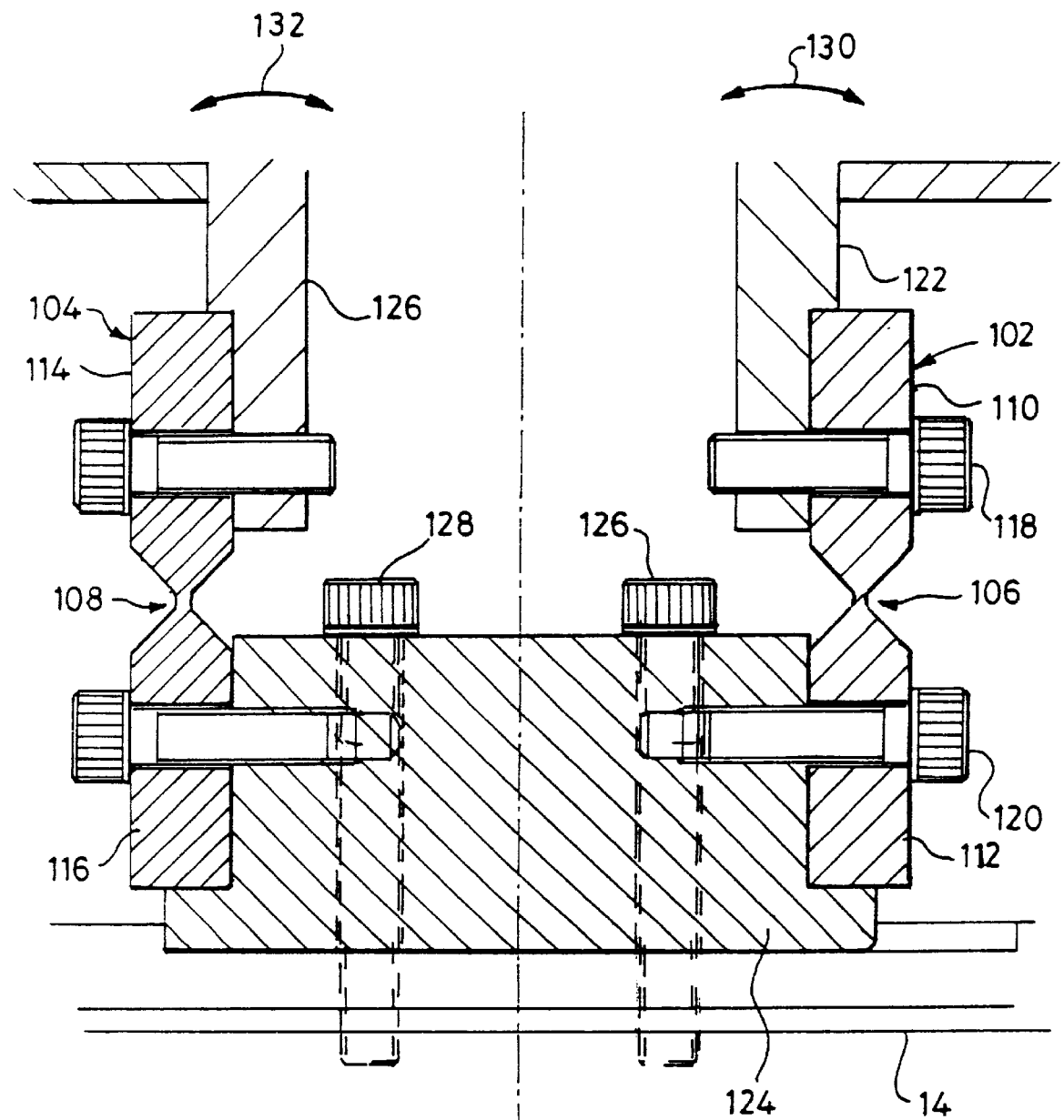
FIG. 5 is an enlarged scale view of two of the flexures visible in FIG. 4.

FIGS. 4 and 5 illustrate how the two structures 42 and 48 are mounted for hinging movement to permit wheel infeed. As shown in FIG. 4, the inboard edges of the two structures 42 and 48 are connected to the platform 14 by means of flexures (sometimes referred to as strip-hinges) two of which are shown at 102 and 104. A second pair in line with the two shown in FIG. 4 are provided towards the other end of the structures 42 and 48 nearer to the machine base 22.

As shown in FIG. 5 to an enlarged scale, each flexure comprises a metal plate, a central region of which is necked to form a reduced width section 106 in the case of flexure 102 and 108 in the case of flexure 104.

The thicker upper and lower regions of each plate denoted by 110 and 112 in the case of 102 and 114 and 116 respectively in the case of flexure 104 are bolted by means of bolts such as 118 and 120 in the case of flexure 102 on the one hand to a flange 122 which forms an integral part of the structure 42 and on the other hand to a metal block 124 itself bolted by means of bolts such as 126 and 128 to the platform 14.

In the same way the flexure 104 is secured to a flange 126 which extends from and forms an integral part of the structure 48.

The metal block 124 is spaced vertically from the flanges 122 and 126 and the necked region 106 and 108 of each of the flexures permits a rocking of the structure 42 or 48 respectively about the necked region 106 and 108 respectively of the flexures supporting the structure from the platform 14.

Whilst the flexures 102 and 104 permit tilting of the structures as denoted by arrows 130 and 132 in FIG. 5, they do not readily permit any other movement of the structures 42 and 48 relative to the platform 14 about any other axis. Consequently the coupling of the structures 42 and 48 to the platform 14 is very stiff in all directions except about the hinge axis generated by the reduced section regions 106 108 etc.

Infeed Drive to Sub-Assemblies

Movement of the structures 42 and 48 is achieved by means of a cam and follower arrangement acting between each of the structures and rigid assemblies mounted to the platform 14 and the end of the machine base 22. One such drive is shown in FIG. 4 as provided within the structure 42. Here a cam 134 is carried by a shaft 136 itself carried in bearings 138 and 140, and is driven by an electric motor 142 through a torsion rigid coupling 144. A follower 146 carried on a shaft (not shown) is carried in bearings 148 and 150 is mounted to the structure 142.

The drive and bearing assembly containing the cam 134 is supported within a rigid structural framework generally designated 152 and this is separate and spaced from the rest of the structure 42 so that the latter can move relative to the assembly 152 as dictated by the movement of the cam 134 and follower 146.

The return force is provided by spring means acting between the structure 152 and the structure 42.

The unit 48 is driven in a similar manner by a similar assembly contained in a structure 154 shown generally in the cut-away region of the structure 48 in FIG. 4.

For simplicity, detail of the return spring is shown in connection with structure 48 but no attempt has been made to show this in the structure 42. Here a thrust rod 156 is secured by means of a threaded and bolted end 158 to the inboard structural component 160 of the structure 48 and the spring 162 is housed within a cylindrical recess 164 formed in the structure 154. A reduced diameter end region 166 prevents the spring from leaving the chamber 164 and a captive washer 168 at the outboard end of the thrust rod 156 holds the spring captive. Movement of the structure element 48 in the direction of arrow 170 results in compression of the spring which provides a restoring force to return the item 48 to its normal upright position when the camming force is removed.

Figure 6:
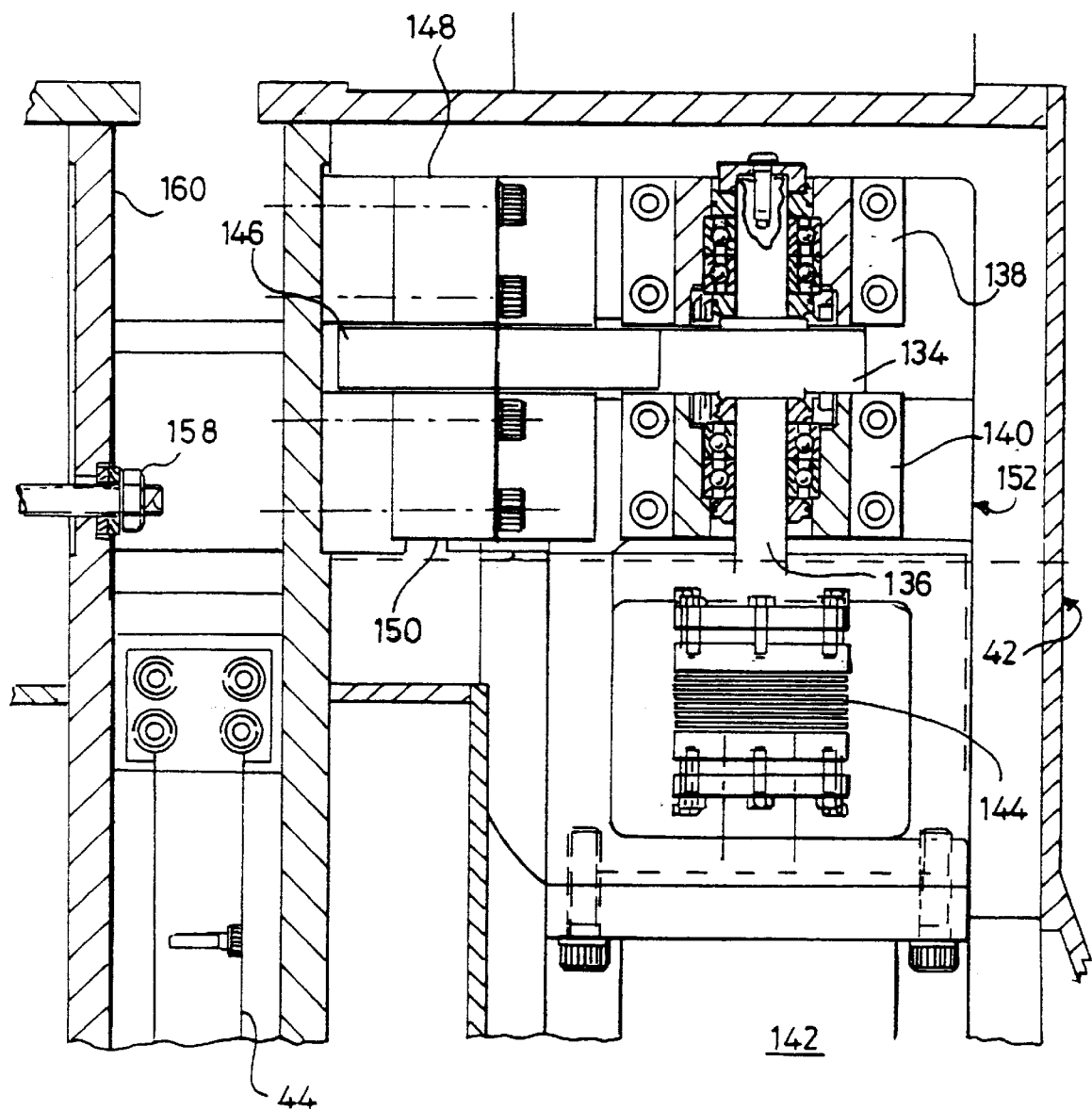
FIG. 6 is an enlarged cross-sectional view through the upper right hand end showing the cam drive and follower and the spring loading of the sub-assemblies.

FIG. 6 shows the upper end of the unit 42 to a larger scale and the same reference numerals have been used throughout to denote similar parts.

Cam Drive

Figure 7:
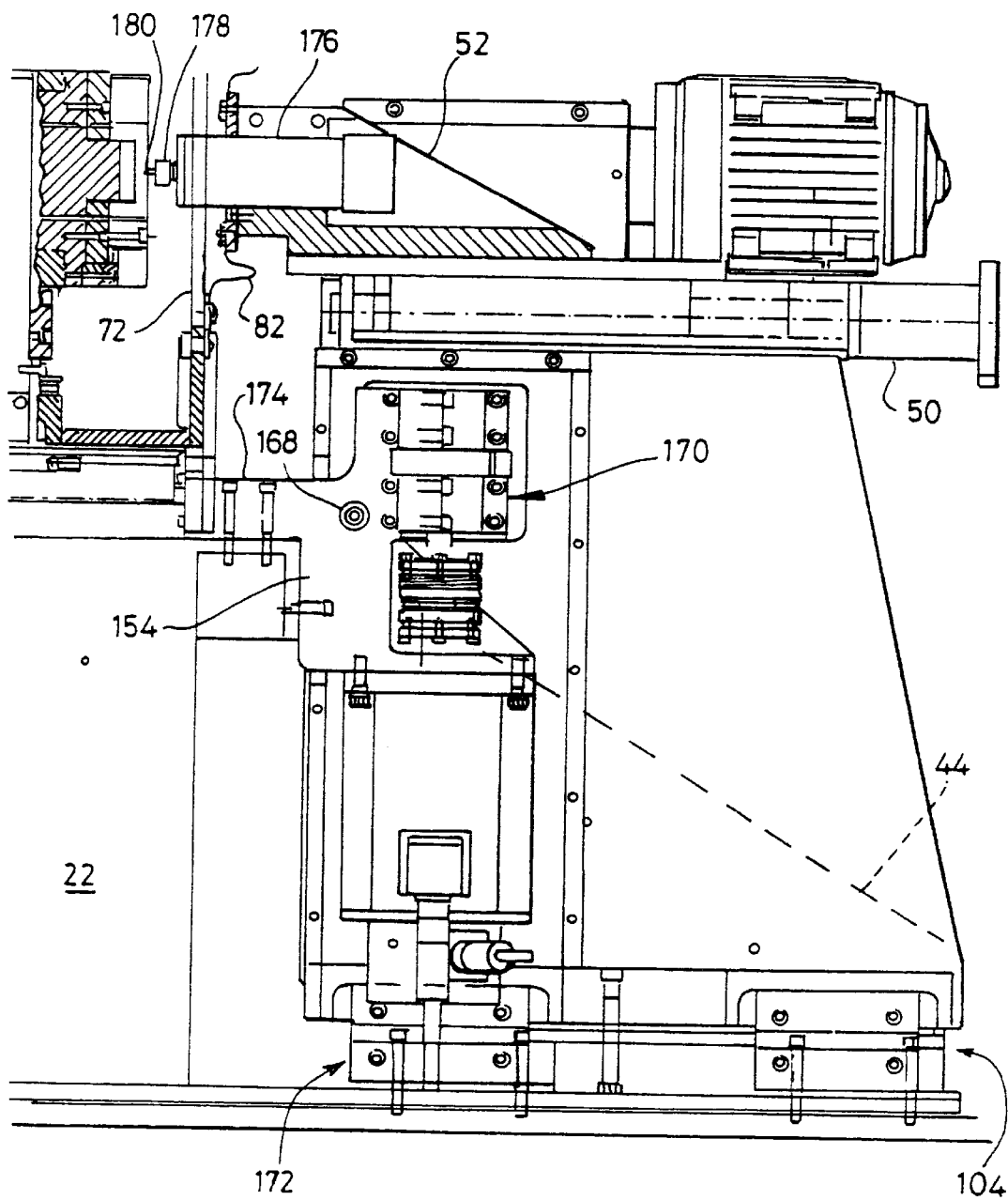
FIG. 7 is a side view of the sub-assembly end of the machine shown in FIG. 2 to an enlarged scale and partly in section.

FIG. 7 is a side view of the end of the machine shown partly in section in FIG. 4, albeit to a slightly reduced scale. As with the other views, it is shown partly cut-away so as to reveal the cam drive mechanism generally designated 170 which acts on the structure 48 and is not shown in FIG. 4. The captive washer 168 is shown at the side of the drive mechanism.

FIG. 7 also shows the two flexure mountings at the base of the unit 48, the outboard one being designated 104 and the inboard one being designated 172.

As previously mentioned each of the cam drive arrangements is carried within a rigid housing 152 and 154 and the latter is more clearly visible in FIG. 7 as is the horizontal leg 174 by which it is bolted to a protruding plate from the end of the base 22.

Also visible in FIG. 7 is the motor 176 for driving the chuck 178 from which the notch grinding spindle 180 protrudes. The motor 176 is carried within a housing 52 previously described in respect of FIG. 1, and the housing 52 slides along a slideway 50 as previously described.

FIG. 7 shows the bellows seal 82 attaching the housing 52 sealingly to the opening in the casing 72 through which the motor 176 and spindle protrude.

Workpiece Transfer

Figure 8:
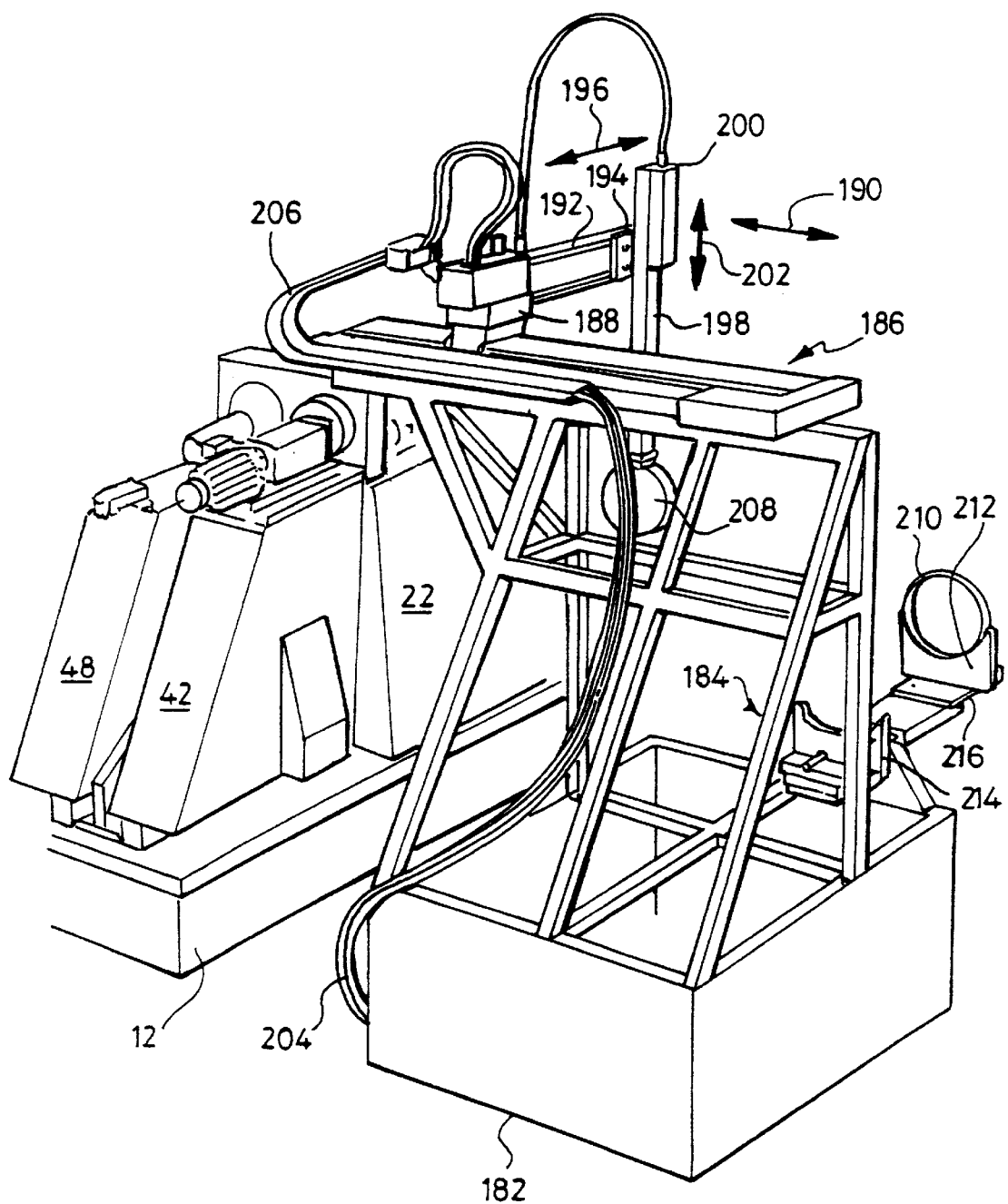
FIG. 8 is a perspective view of a workpiece loading and unloading mechanism which is adapted to be mounted on the right hand side of the end of the machine shown in FIG. 3, part of which is visible in FIG. 8.

The handling of circular plate-like wafers of silicon typically 100 200 or 300 mm diameter or larger is provided by a robotic handling means shown in FIG. 8. This comprises a base 182 and structural framework generally designated 184 extending upwardly therefrom to provide a support for a linear slideway generally designated 186 along which a carriage 188 can slide in the direction of the arrow 190. A second slide 192 protrudes from the housing 188 at right angles to the slideway 186 and a sliding member 194 is adapted to move therealong in the direction of the arrow 196. An arm 198 protrudes from the housing 194 and a drive attached thereto and shown at 200 provides for movement of the arm 198 in the direction of the arrow 202. Electric power for the drives 200 and the drives in the housing 188 is provided via a multi-way umbilical 204 which is retained in a flexible safety harness 206 attached to the linear track 186.

The lower end of the arm 198 is a vacuum chuck 208 and by suitable maneuvering of the carriages 188 and 200 and the arm 198, so the vacuum closure 208 can be positioned in front of a wafer 210 which is held upright in a supporting sleeve 212. An empty supporting sleeve at 214 is also shown ready to receive a processed wafer.

The base 182 is positioned close to the machine bed 12 part of which is visible in FIG. 8. After a machining operation, the two parts of the housing 72 are separated as previously described with references to FIGS. 1 to 3, and this leaves the finished workpiece 36 exposed and available to be picked up by the arm 198 and vacuum chuck 208. To this end the transfer mechanism of FIG. 8 is operated so as to position the chuck 208 opposite the wafer on the workhead so as to retrieve the finished wafer 36 and transfer this to the empty sleeve 214.

Movement of the carriage 194 further out towards the sleeve 212 positions the chuck 208 in front of an unground workpiece 210, and after picking this up, it can be transferred into the inspection station and thereafter the working environment of the grinding machine for attachment to the vacuum chuck 30 in place of the previous wafer 36, for grinding.

It will be appreciated that a plurality of sleeves or cassettes can be provided on the track 216 and all the workpieces located therein can be removed, centred, ground, inspected and returned thereto in turn.

Where an overall enclosure is provided for the apparatus as previously described, the transfer mechanism including its base 182 is preferably located within the enclosure, and a self closing door in an opening therein, is provided to allow cleaned wafers to be inserted and removed.

Wafer Centering

Figure 9:
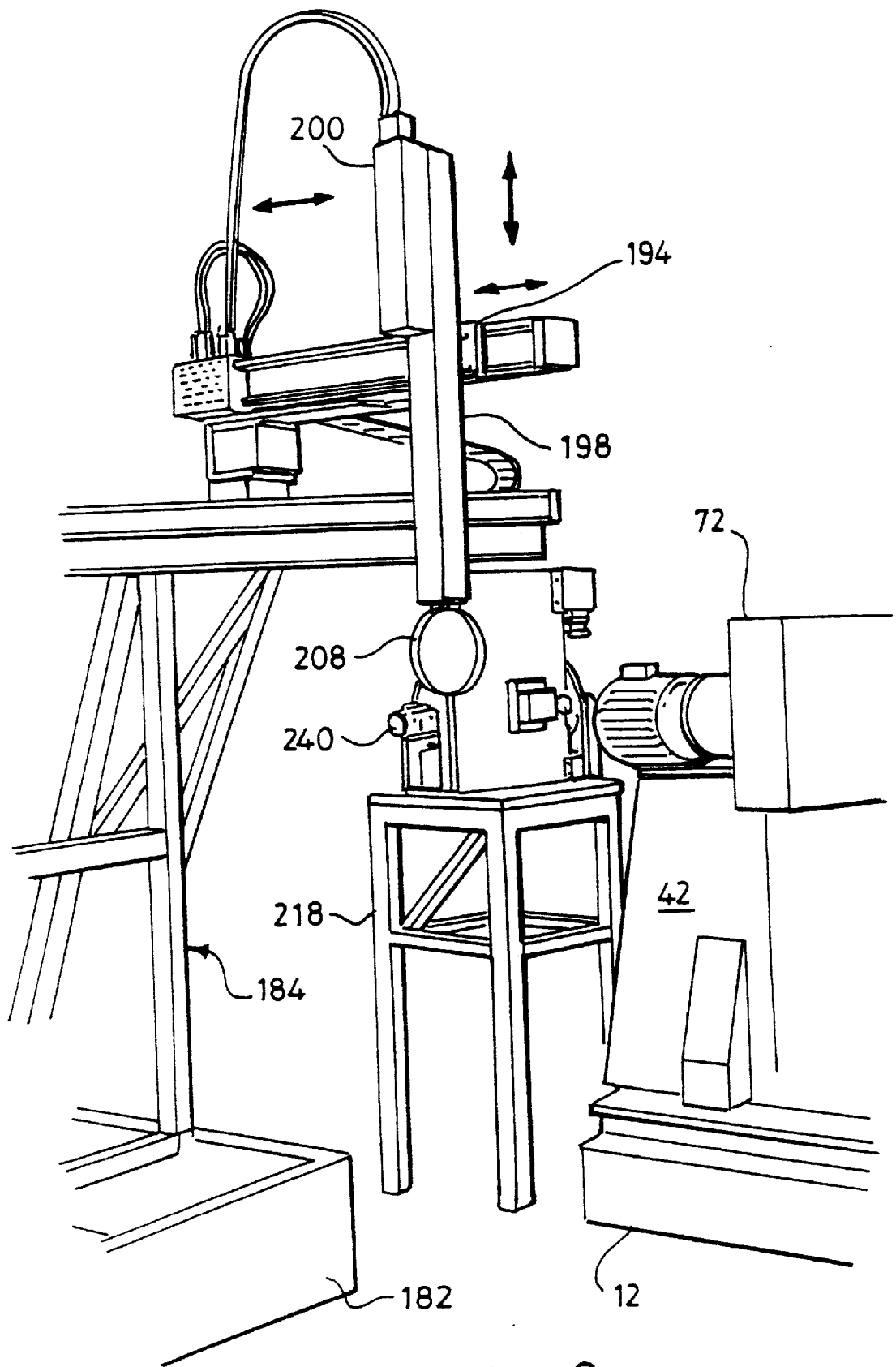
FIG. 9 is an opposite perspective view of the component handling apparatus of FIG. 8 which also shows disc inspection apparatus and the right hand end of the machine as shown in FIG. 2.
Figure 10:
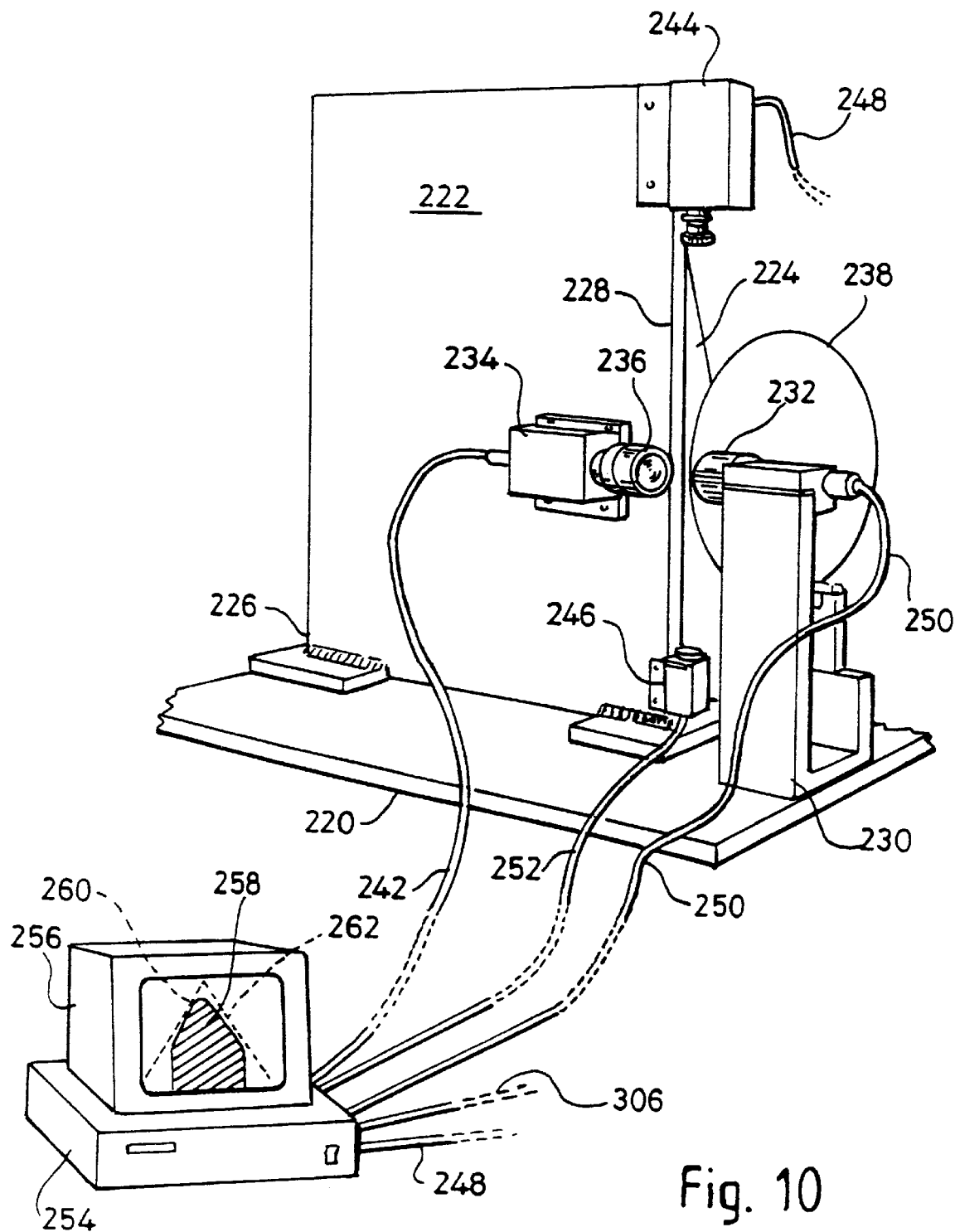
FIG. 10 is a perspective view from the opposite end of the disc inspection apparatus shown in FIG. 9, to an enlarged scale.

As an intermediate step before and after grinding, (preferably during the grinding of another wafer), each of the wafers is positioned in the inspection apparatus shown in FIGS. 9 and 10, to enable the centre of the wafer to be determined, and thereby allow it to be accurately positioned on the chuck 30 for grinding, and afterwards to enable the edge profile of the wafer to be inspected after grinding, before it is returned to its storage sleeve.

Workpiece Inspection

FIG. 9 is an overall view showing where the inspection apparatus sits in relation to the grinding machine and the robotic wafer handling system of FIG. 8. As before the same reference numerals are used throughout. The robotic wafer handling system is more fully described in our copending Patent Application GB-A-2316637.

The inspection apparatus comprises a stand 218 on which is located a support framework comprised of a base 220 and an upright plate 222. A triangular stiffening plate 224 extends from the rear of the plate 222 and both 222 and 224 are welded to the plate 220 as at 226.

Spaced from vertical edge 228 of the plate 222 is a support bracket 230, and a lamp and projection lens arrangement generally designated 232 is supported at the upper end of the bracket 230. A first camera 234 having a lens 236 is mounted on the plate 222 to view the edge of the disc 238 which is back lit by lamp 232.

As best seen in FIG. 9 a motor 240 is mounted on the rear of the plate 222. The motor drives a vacuum chuck (not visible) on which the disc 238 which is to be inspected is planted by the robotic arm 198 and vacuum chuck 208.

Rotation of the motor 240 rotates the wafer 238. By positioning this so that the edge intersects the field of view of the camera lens 236 electrical signals can be derived from the camera output for feeding via a cable 242 to signal analysis apparatus (not shown) for processing data obtained from the signals.

A second camera 244 is mounted on the support plate edge 228, to view the edge of the disc 238 tangentially, so as to obtain information on the profile of the edge. The disc edge is back lit by lamp 246 and signals from the camera 244 are supplied along cable 248. Power for the lamps 232 and 246 is supplied as required along cables 250 and 252 respectively.

A computer 254 is supplied with signals from the cameras 234 and via cables 242 and 248 and controls the cameras and their lamps 232 and 246 via return signal paths along 242 and 248 and via cables 250 and 252 respectively. The output camera 244 can be displayed on a monitor 256 as required, and the profile of the edge of the wafer 238 is shown at 258 together eg with a computer generated template 260, 262 showing the ideal angle for the sides of the profile.

Workpiece Centering

This is achieved using the technique described in our copending application filed concurrently herewith under reference C403/W, using the robotic wafer handling system of FIGS. 8 to 10 and the signals from camera 234, obtained as the circular wafer is rotated through its field of view.

Display of Notches and Flats

Figure 11:
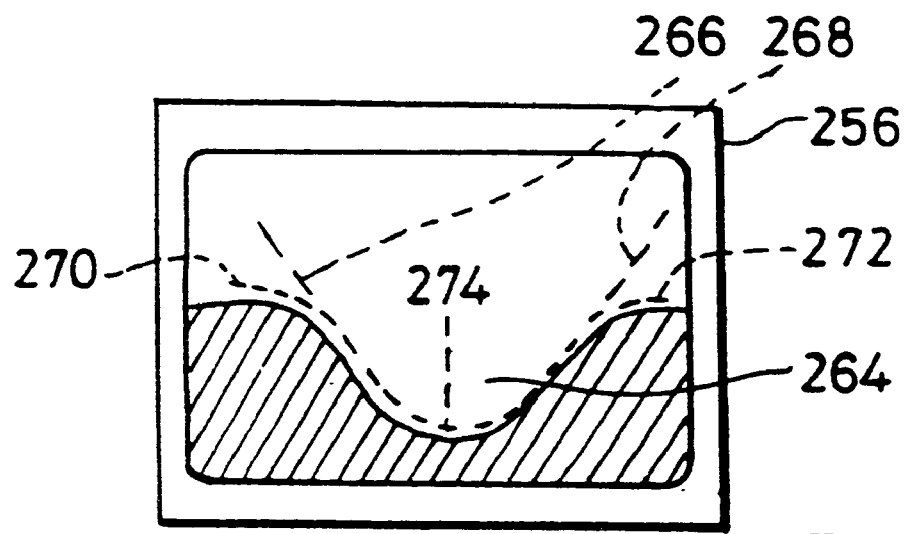
FIG. 11 is a view of the monitor screen showing the notch as viewed by camera 234.

FIG. 11 is a view of the monitor 256, this time set to display the output from camera 234, when a notched wafer is in position on the vacuum chuck (not shown in FIG. 10) on which the wafer 238 is mounted, where the wafer has been rotated so that the notch is in the field of view of the camera. The notch is visible at 264 and a computer generated template (shown dotted at 266 and 268) is also shown displayed, superimposed on the picture of the notch, to indicate the required angles for the two sides of the notch. Two additional template lines are displayed at 270 and 272 to show the require radii at the entrance to the notch and a further template line 274 is displayed showing the required radius at the bottom of the notch.

Figure 12:
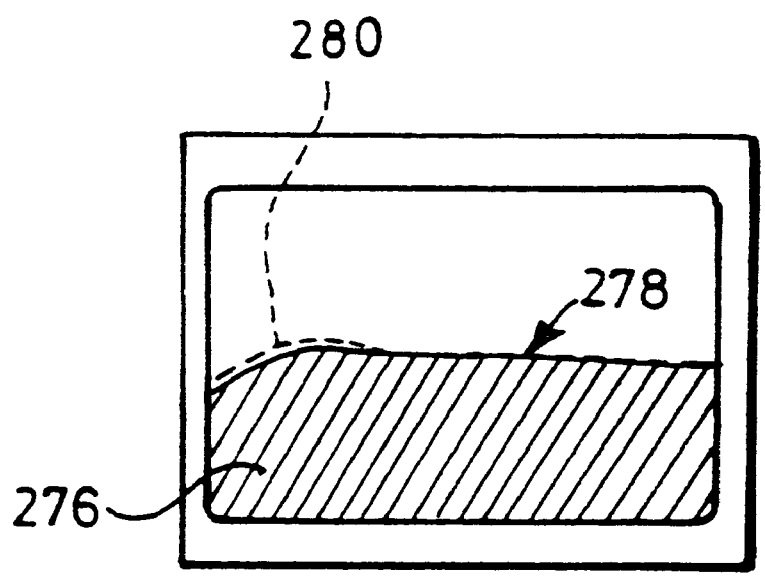
FIG. 12 is a view of the monitor screen showing a flat in a wafer edge as viewed by camera 234.

FIG. 12 is a similar view of the monitor 256 this time displaying one end of a flat peripheral region of a circular wafer if viewed by the camera 234. Here the display of the wafer is denoted by reference numeral 276 and the flat by 278 and the required radii at the ends of the flat is described by a computer generated template line 280.

Wafer Thickness Measurement

Figure 13:
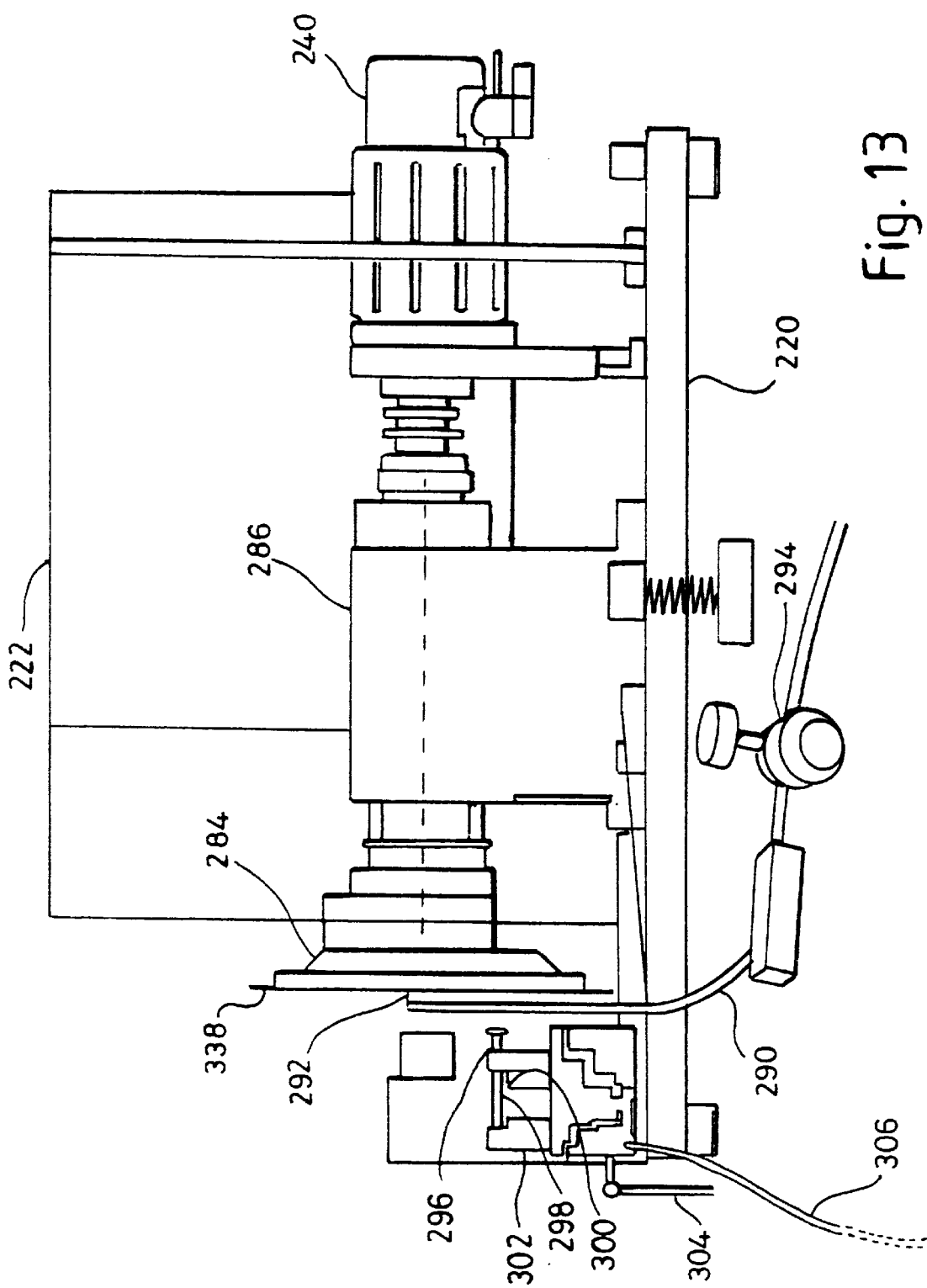
FIG. 13 is a side view of the rear of the assembly of FIG. 10, showing the drive between the motor and vacuum chuck, and also showing where a thickness measuring probe can be positioned for determining wafer thickness before transferring the wafer to the workhead.

FIG. 13 shows the rear of the assembly of FIG. 10 and shows the plate 222 and motor 240 driving a vacuum chuck 284 via a drive 286.

A fluid line 290 with jet 292 serves to deliver a jet of air to clean and dry the edge of the wafer 238 and the flow is controlled by a valve 294.

It is important to know the thickness of the wafer 238 before it is mounted on the vacuum chuck 30 on the workhead (see FIGS. 1 and 2) so that the axial shift required of the workhead or workspindle to bring the appropriate grinding groove therein accurately into engagement with the edge of the disc, can be determined by the control system and appropriate drive signals generated for moving the workhead or work spindle the required distance. The thickness is determined using a probe 296 which is carried on a spindle 298 slidable in guides 300, 302 and movable under air pressure via a pipeline 304 into engagement with the face of the wafer 238. The distance travelled from a fixed home position is noted.

By performing the same distance movement measurement without the wafer in place, given the distance from the fixed home position to the face of the chuck 284, and since the wafer 238 is held against that face when in position, the difference between the two distance measurements is equal to the thickness of the wafer.

The distance moved by the probe is sensed by an accurate position sensing encoder and the signals supplied along cable 306 to the computer 254, and the thickness dimension may be displayed on the monitor (if desired).

The computer 254 may form part of the computer based control system in housing 10 (see FIG. 1) and/or signals generated by the computer 254 may be supplied to the computer based control system in 10, so that the thickness dimension is available for controlling the axial shift of the workhead or work spindle assembly.

Multiple Grinding Wheel Assembly

In order to save machine downtime, the grinding wheel may be made up of a sandwich of different grinding wheels each dedicated to a particular purpose.

Figure 14:
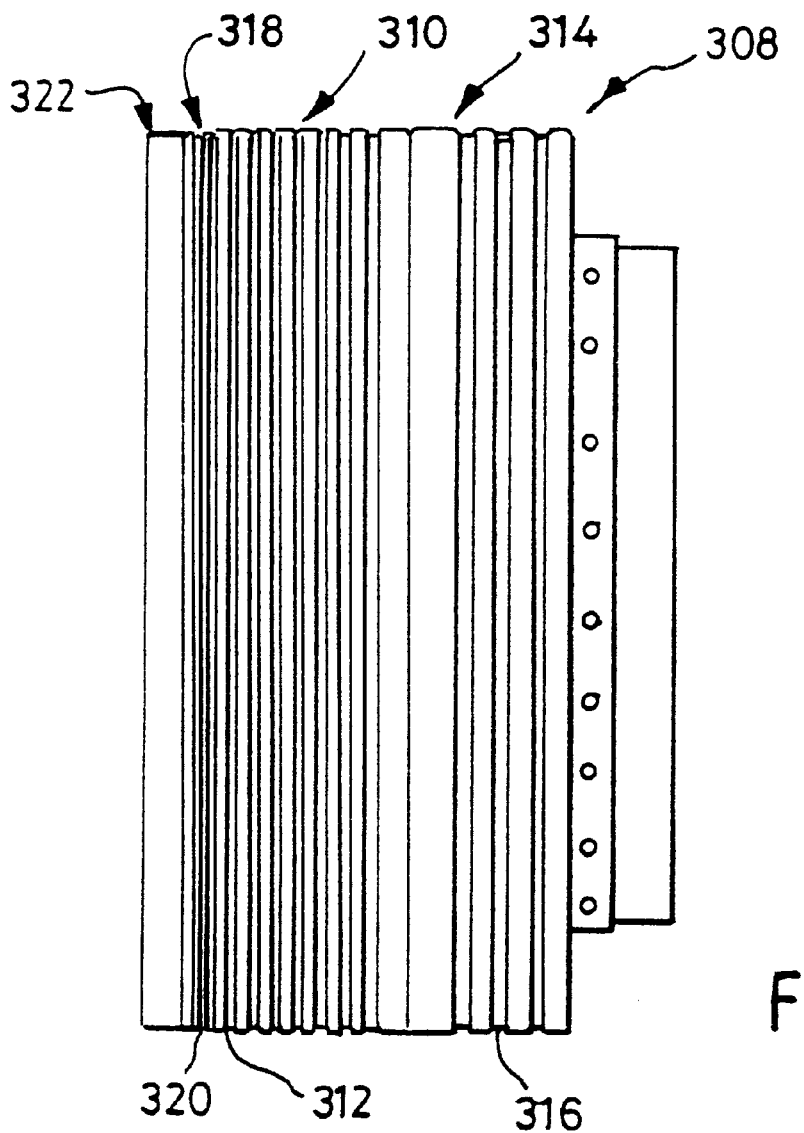
FIG. 14 is a side view of a multiple grinding wheel assembly such as may be used in the machine show in FIG. 1 et seq.

Such a wheel is shown at 308 in FIG. 14, in which a sandwich of four wheel sections is shown.

The primary wheel 310 is a resin bonded CBN wheel having six grinding grooves in its cylindrical surface, one of which is shown at 312. This is the wheel section which is used to grind the edge of a wafer which requires only a little material to be removed before finishing.

Wheel section 314 is a diamond wheel containing three grooves, one denoted by reference 316. This section is used for finish grinding the wafer edge.

It is to be understood that both wheels can have any number of grooves—typically in the range 1—10.

Wheel section 318 is a metal bonded CBN or diamond wheel with a single groove 320, which is an optional wheel which can be used to rough grind a wafer edge before the softer resin bonded wheel 310 is brought into play.

Wheel section 322 is a further optional wheel typically of cerium oxide, which can be used to polish the wafer edge after finishing by wheel section 314, by running the wheel spindle at an appropriate speed.

Notch Grinding Wheel

Figure 15:
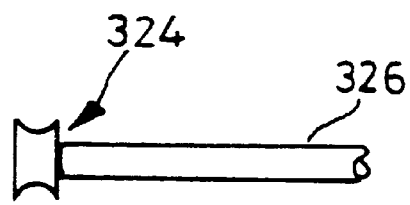
FIG. 15 is a side view of a notch grinding wheel such as may be employed in that machine.

FIG. 15 shows to an approximately similar scale, a notch grinding wheel 324 mounted at the end of a spindle 326. Its "concave" annular grinding surface is typically diamond plated.

Wheel Dressing Procedure

Figure 16:
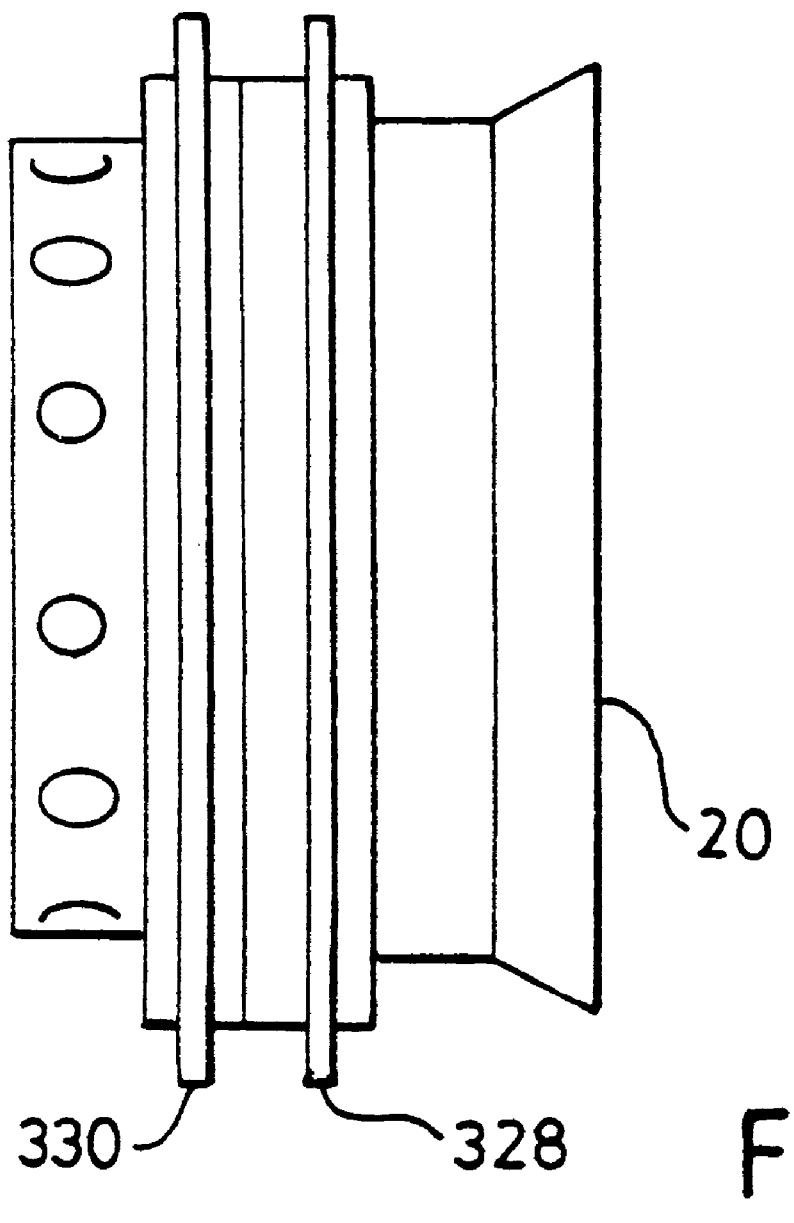
FIG. 16 is a side view of a workpiece vacuum chuck and dressing wheel assembly.

As shown in FIG. 16, the dressing/forming wheel(s) are mounted on the same spindle as the vacuum chuck 30 to which the workpiece(s)/wafer(s) 36 are to be attached.

Typically the dressing/forming wheel is a two part assembly of:
 (a) a metal bonded diamond wheel 328 for rough grinding grooves in the CBN wheel section 310, of FIG. 14, and
 (b) a metal bonded diamond wheel 330 which incorporates much smaller diameter grit, and is adapted to finish grind the grooves such as 312 in the CBN wheel section 310 of FIG. 14.

CBN grinding wheel such as section 310 in FIG. 14 are normally supplied without grooves such as 312, and after mounting a new CBN wheel section 310, the first step is the formation of grooves such as 312 thereon. This is achieved using wheel 328 of FIG. 16, and then wheel 330.

After wear has occurred in the grooves in 310, wheel 330 is employed to dress and re-form the grooves as required.

Both forming wheels have access to both grinding wheels. Conventionally, both forming wheels are used to form both the roughing (CBN) grinding wheel and the finishing (diamond) grinding wheel.

Intermediate Wafer Store

Figure 17:
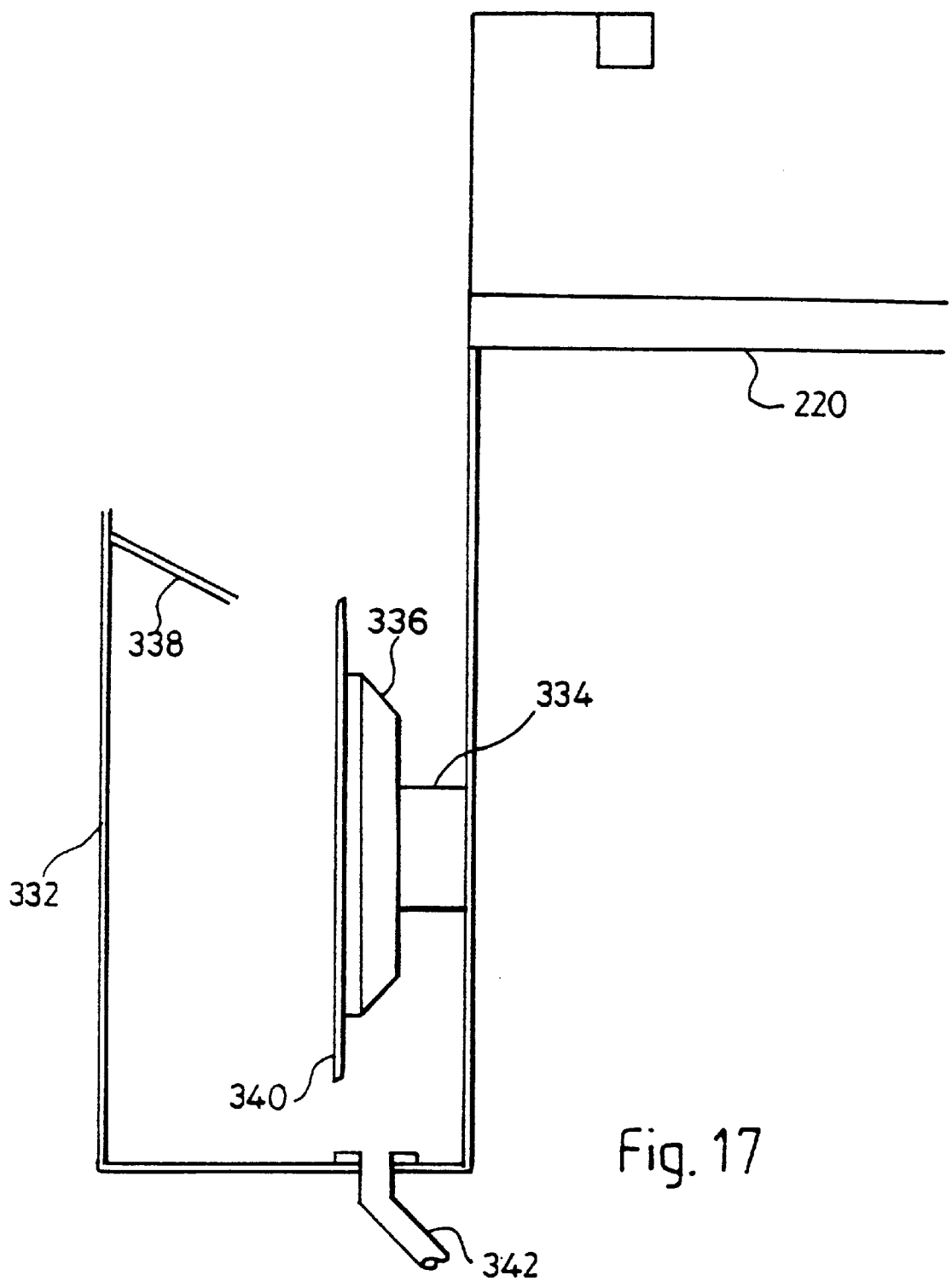
FIG. 17 is a side view of a wash station which can also serve as an intermediate wafer store.

As shown in FIG. 17, below the thickness measuring probe location shown in FIG. 13, is situated an open top rectilinear housing 332 into which wafers can be lowered by the arm 198.

Extending into the housing is a spindle 334 and vacuum chuck 336 on which wafers can be planted and held, and by which such wafers can be rotated. Drive to the spindle 334 may be obtained for example from the motor 240.

Protruding into the housing 332 is a jet 338 which can be supplied with fluid under pressure such as water or air, and the jet is directed towards the face and edge region of wafers mounted on the chuck. One such wafer is shown at 340. A drain 342 conveys away any surplus fluid.

The housing and vacuum chuck provides a useful parking place for wafers which have been edge ground and are waiting to be placed on the vacuum chuck 284 of the inspection apparatus, for edge profile inspection, or have been inspected and are waiting to be returned to their sleeve such as 214 in FIG. 8.

What is claimed is:

1. A method of grinding the edge of a disc workpiece using a grinding machine having mounted thereon a grooved grinding wheel, in which the groove is formed in situ using a forming wheel also mounted on the grinding machine, and further comprising the steps of moving the grinding wheel and forming wheel into engagement so as to form the groove around the edge of the grinding wheel corresponding in cross-section to the complement of the shape to be formed around the workpiece edge during grinding, engaging the grinding wheel with at least one workpiece, grinding the edge thereof into the desired shape, and after the workpiece has been ground or after a succession of workpieces have been ground, re-engaging the grinding wheel and the forming wheel with the grinding wheel remaining in situ, to re-form the groove in the grinding wheel to correct for wear.

2. A method of grinding as claimed in claim 1 comprising two stages, a first in which a resin bonded CBN wheel is advanced to rough grind the workpiece edge and a second stage in which a resin bonded diamond wheel is advanced to finish grind the edge.

3. A method as claimed in claim 2 wherein the method includes the further steps of forming and reforming both grinding wheels in situ on the machine by plunge grinding the desired form around the grinding surface of each grinding wheel using a forming wheel.

4. A method of grinding the edge of a silicon wafer workpiece comprising two stages, a first in which a metal or resin bonded CBN wheel is advanced to rough grind the workpiece edge and a second stage in which a resin bonded diamond wheel is advanced to finish grind the edge, and further comprising the step of forming each wheel in situ using a forming wheel, after at least one wafer workpiece has been ground.

* * * * *